United States Patent
Eickelmann et al.

(10) Patent No.: US 9,825,192 B2
(45) Date of Patent: *Nov. 21, 2017

(54) SOLAR CELL WITH REDUCED ABSORBER THICKNESS AND REDUCED BACK SURFACE RECOMBINATION

(71) Applicant: International Business Machines Corporation, Armonk, NY (US)

(72) Inventors: Hans-Juergen Eickelmann, Nieder-Hilbersheim (DE); Michael Haag, Rodenbach (DE); Ruediger Kellmann, Mainz (DE); Markus Schmidt, Seibersbach (DE); Johannes Windeln, Bodenheim (DE)

(73) Assignee: International Business Machines Corporation, Armonk, NY (US)

( * ) Notice: Subject to any disclaimer, the term of this patent is extended or adjusted under 35 U.S.C. 154(b) by 18 days.

This patent is subject to a terminal disclaimer.

(21) Appl. No.: 14/844,450

(22) Filed: Sep. 3, 2015

(65) Prior Publication Data
US 2015/0380587 A1    Dec. 31, 2015

Related U.S. Application Data

(62) Division of application No. 13/650,494, filed on Oct. 12, 2012.

(51) Int. Cl.
*H01L 31/056* (2014.01)
*H01L 31/18* (2006.01)
(Continued)

(52) U.S. Cl.
CPC ........ *H01L 31/02168* (2013.01); *H01L 31/022425* (2013.01); *H01L 31/03923* (2013.01);
(Continued)

(58) Field of Classification Search
CPC ......... H01L 31/0224; H01L 31/022425; H01L 31/022433; H01L 31/03923; H01L 31/046; H01L 31/056; H01L 31/1888
See application file for complete search history.

(56) References Cited

U.S. PATENT DOCUMENTS

| 5,994,225 A | 11/1999 | Liu et al. |
| 7,053,294 B2 | 5/2006 | Tuttle et al. |
| (Continued) | | |

FOREIGN PATENT DOCUMENTS

| WO | 2010116723 | 10/2010 |
| WO | 2012102451 | 8/2012 |

OTHER PUBLICATIONS

Ramanathan et al., Properties of High-Efficiency CIGS Thin-Film Solar Cells, The 31st IEEE Photovoltaic Specialists Conference and Exhibition, Jan. 3-7, 2005.
(Continued)

*Primary Examiner* — Bethany L Martin
(74) *Attorney, Agent, or Firm* — Lieberman & Brandsdorfer, LLC

(57) ABSTRACT

Manufacture for an improved stacked-layered thin film solar cell. Solar cell has reduced absorber thickness and an improved back contact for Copper Indium Gallium Selenide solar cells. The back contact provides improved reflectance particularly for infrared wavelengths while still maintaining ohmic contact to the semiconductor absorber. This reflectance is achieved by producing a back contact having a highly reflecting metal separated from an absorbing layer with a dielectric layer.

18 Claims, 3 Drawing Sheets

(51) Int. Cl.
  *H01L 31/0224* (2006.01)
  *H01L 31/0216* (2014.01)
  *H01L 31/0392* (2006.01)
  *H01L 31/048* (2014.01)
  *H01L 31/0749* (2012.01)

(52) U.S. Cl.
  CPC .......... *H01L 31/048* (2013.01); *H01L 31/056* (2014.12); *H01L 31/0749* (2013.01); *H01L 31/186* (2013.01); *H01L 31/1884* (2013.01); *Y02E 10/52* (2013.01); *Y02E 10/541* (2013.01); *Y02P 70/521* (2015.11)

(56) References Cited

U.S. PATENT DOCUMENTS

| | | |
|---|---|---|
| 7,833,821 B2 | 11/2010 | Basol |
| 2002/0011641 A1 | 1/2002 | Oswald et al. |
| 2007/0166874 A1 | 7/2007 | Lin et al. |
| 2007/0193623 A1 | 8/2007 | Krasnov |
| 2008/0251120 A1 | 10/2008 | Malmstrom et al. |
| 2009/0178706 A1* | 7/2009 | Sheats ................. H01L 27/3204 136/251 |
| 2009/0277499 A1 | 11/2009 | Aoki et al. |
| 2010/0224249 A1* | 9/2010 | Fukunaga ............... C25D 11/04 136/259 |
| 2010/0248420 A1 | 9/2010 | Okamura et al. |
| 2011/0088750 A1 | 4/2011 | Stolt et al. |
| 2011/0100443 A1 | 5/2011 | Clevenger et al. |
| 2011/0232758 A1 | 9/2011 | Khanarian et al. |
| 2011/0259395 A1 | 10/2011 | Wieting et al. |
| 2011/0259418 A1 | 10/2011 | Hollars |
| 2011/0290308 A1* | 12/2011 | Korevaar ............ H01L 31/0296 136/255 |
| 2012/0031492 A1* | 2/2012 | Sevvana ............ H01L 21/02491 136/262 |
| 2012/0048342 A1 | 3/2012 | Lim et al. |
| 2013/0000700 A1 | 1/2013 | Lee |

OTHER PUBLICATIONS

Repins et al., Characterization of 19.9% Efficieny CIGS Absorbers, The 33rd IEEE Photovoltaic Specialists Conference, May 11-16, 2008.

Romeo et al., Development of Thin-Film Cu(In,Ga)Se2 and CdTe Solar Cells, Progress in Photovoltaics: Research and Applications, 2004; 12:93-111.

Lundberg et al., Influence of the Cu(In,Ga)Se2 Thickness and Ga Grading on Solar Cell Performance, 2003, Progressive Photovoltaics, 11, 77-88.

* cited by examiner

SOLAR CELL WITH REDUCED ABSORBER THICKNESS AND REDUCED BACK SURFACE RECOMBINATION

CROSS-REFERENCE TO RELATED APPLICATION(S)

This application is a divisional of U.S. patent application Ser. No. 13/650,494, filed Oct. 12, 2012, titled "Solar Cell With Reduced Absorber Thickness And Reduced Back Surface Recombination", which is hereby incorporated by reference.

BACKGROUND

Technical Field

The present embodiments relate to thin film solar cells. More specifically, the embodiments relate to a stacked-layered thin film solar cell with improved performance characteristics.

Description of the Prior Art

The art of solar cells addresses the conversion of radiation into electrical energy. Much research has been conducted to maximize the efficiency of a solar cell. There is a demand to further reduce the absorber thickness of a solar cell to reduce material costs, decrease the time required for deposition processing, and increase the throughput of deposition equipment. Shortcomings however, include the back contact of a solar cell having reduced reflectance for infrared wavelengths and a surface with a high probability for charge carrier recombination leading to decreased efficiency of the solar cell.

SUMMARY

The embodiments disclosed herein comprises a process for preparing a thin-film solar cell.

In one aspect, the process employs etching one or more apertures, filling at least one aperture with a material, and depositing a transparent layer. A first aperture is etched into a second side of a reflective layer and a second aperture into a second side of a dielectric layer. The first and second apertures form a third aperture. A first side of the dielectric layer is in contact with a body, with the body comprising a substrate having a first side and a second side, and a first conducting material layer having a first side and a second side, the first side of the first conducting material in contact with the second side of the substrate. The third aperture is filled with a layer of Copper Indium Gallium Selenide (CIGS) having a first side and a second side. The first side of the CIGS is in contact with the first conductive layer of the dielectric within the third aperture and covers the second side of the dielectric layer and the second side of the CIGS in contact with a first side of a first transparent layer. A second transparent layer is deposited with a first side and a second side on the first transparent layer. This depositing includes the first side of second transparent layer in contact with a second side of the first transparent layer. The second transparent layer is a conducting material.

BRIEF DESCRIPTION OF THE DRAWINGS

The drawings referenced herein form a part of the specification. Features shown in the drawings are meant as illustrative of only some embodiments, and not of all embodiments unless otherwise explicitly indicated. Implications to the contrary are otherwise not to be made.

DETAILED DESCRIPTION

It will be readily understood that the components of the present embodiments, as generally described and illustrated in the Figures herein, may be arranged and designed in a wide variety of different configurations. Thus, the following detailed description of the present embodiments of the apparatus, system, and method, as presented in the Figures, is not intended to limit the scope of the embodiments, as claimed, but is merely representative of selected embodiments.

Reference throughout this specification to "a select embodiment," "one embodiment," or "an embodiment" means that a particular feature, structure, or characteristic described in connection with the embodiment is included in at least one embodiment. Thus, appearances of the phrases "a select embodiment," "in one embodiment," or "in an embodiment" in various places throughout this specification are not necessarily referring to the same embodiment.

Furthermore, the described features, structures, or characteristics may be combined in any suitable manner in one or more embodiments. In the following description, numerous specific details are provided, such as examples of sensors, detectors, etc., to provide a thorough understanding of embodiments. One skilled in the relevant art will recognize, however, that the embodiments can be practiced without one or more of the specific details, or with other methods, components, materials, etc. In other instances, well-known structures, materials, or operations are not shown or described in detail to avoid obscuring aspects of the embodiments.

The illustrated embodiments will be best understood by reference to the drawings, wherein like parts are designated by like numerals throughout. The following description is intended only by way of example, and simply illustrates certain selected embodiments of devices, systems, and processes that are consistent with the embodiment(s) as claimed herein.

In the following description of the embodiments, reference is made to the accompanying drawings that form a part hereof, and which shows by way of illustration the specific embodiment(s) which may be practiced. It is to be understood that other embodiments may be utilized because structural changes may be made without departing form the scope of the present embodiments.

Figure 1:
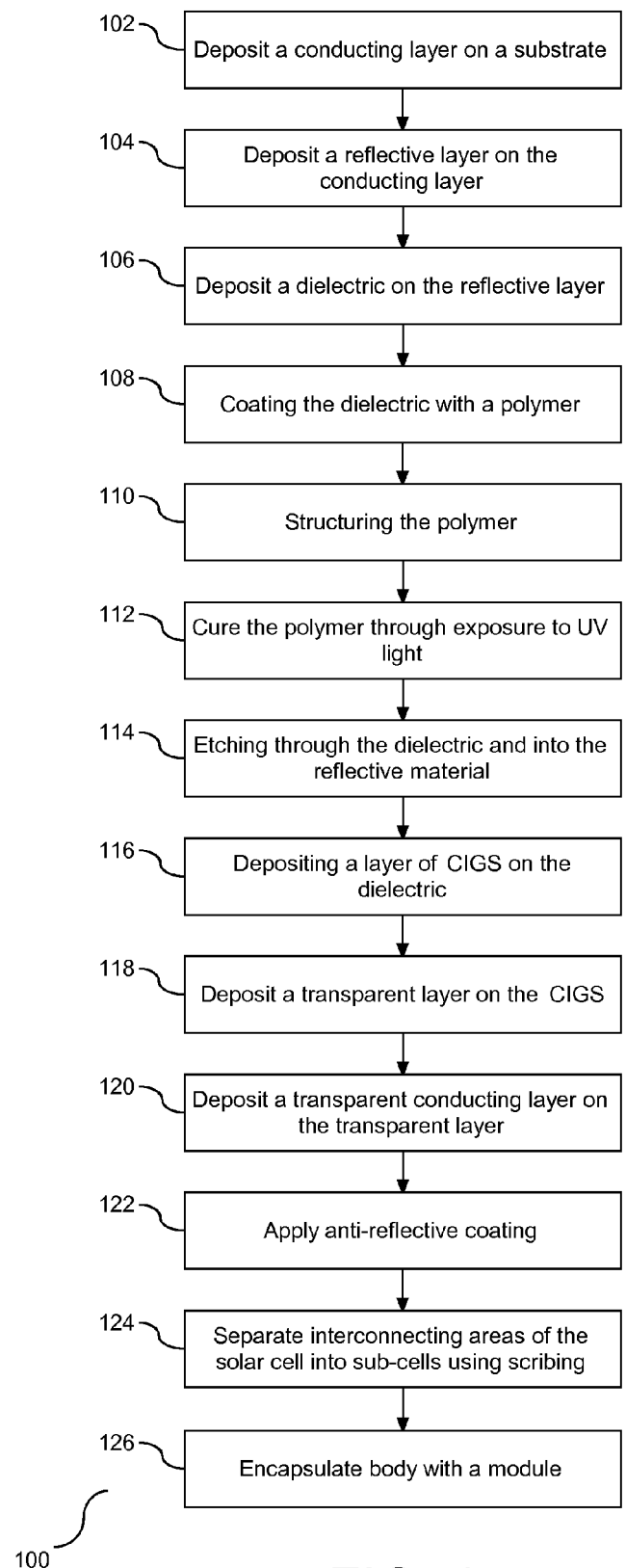
FIG. 1 depicts a flow chart illustrating a process for creating an improved solar cell.

FIG. 1 depicts a flow chart (100) illustrating a method for manufacture of a stacked-layered thin film solar cell. A conducting layer is deposited on a substrate such that a second side of the substrate is in communication with a first side of a conducting layer (102). A reflective layer is deposited on the conducting layer such that a first surface of the reflective layer is in communication with a second side of the conducting layer (104). The second side of the conducting layer is oppositely disposed from the first side of the conducting layer. A dielectric layer is deposited on the reflective layer. Specifically, a first side of the dielectric layer is deposited such that it is in communication with a second side of the reflecting layer, which is oppositely disposed from the first side of the reflective layer (106). A second side of the dielectric layer, which is oppositely disposed to the first side of the dielectric layer, is coated with a polymer (108). The polymer is structured (110), and in one embodiment, is cured by exposing the polymer to ultraviolet radiation (112). At least one aperture is created within both the dielectric layer and the reflective layer (114). The aperture is formed to create electrical contact between the conducting layer and the semiconducting layer. In one embodiment, the aperture is formed by etching through the dielectric layer and into the layer comprised of a reflective material. Accordingly, an insulating dielectric layer is in between the semiconducting material and the conducting material, and the aperture through the reflective layer is employed for ohmic contact.

A layer of Copper Indium Gallium Selenide (CIGS) is deposited on the second side of the dielectric layer (116). The CIGS functions as a p-type semiconductor. The CIGS layer is deposited such that a first side of the CIGS is in physical contact with the second side of the dielectric and fills at least one of the apertures formed in the dielectric and reflective layers. In one embodiment, the CIGS is deposited on the second side of the dielectric layer (116) by co-evaporating copper, gallium, indium, and in one embodiment, selenium, on the dielectric (116). A first transparent layer is deposited on the CIGS layer such that a first side of the first transparent layer is in communication with a second side of the CIGS layer, oppositely disposed from the first side of the CIGS layer (118), including Cadmium (Cd), Sulfur (S), and/or Zinc Oxide (ZnO), or any other transparent material that readily forms a charge carrier separating junction with the CIGS layer. A conducting second transparent layer is deposited on the first transparent layer such that a first side of the conducting second transparent layer is in communication with a second side of the first transparent layer, oppositely disposed from the first side of the first transparent layer (120). In one embodiment, the conducting layer and the reflecting layer are deposited through the use of sputtering. An anti-reflective coating is applied to a second side of the conducting second transparent layer (122). The second side of the conducting second transparent layer is oppositely disposed to the first side of the conducting second transparent layer. The anti-reflective coating decreases the reflectance of radiation contacting the conducting second transparent layer, allowing for less reflection and hence greater absorption of radiation and thus an increased efficiency of the solar cell. In one embodiment, areas of the solar cell are separated and interconnected into sub cells using mechanical or laser-scribing (124) in order to increase module voltage and reduce ohmic losses within the interconnections. In another embodiment, the stacked-layered thin film solar cell as described above is encapsulated to form a module (126) to protect the layers from mechanical and environmental degradation, such as corrosion. Accordingly, a stacked-layered thin film solar cell is manufactured by the method as described.

Figure 2:
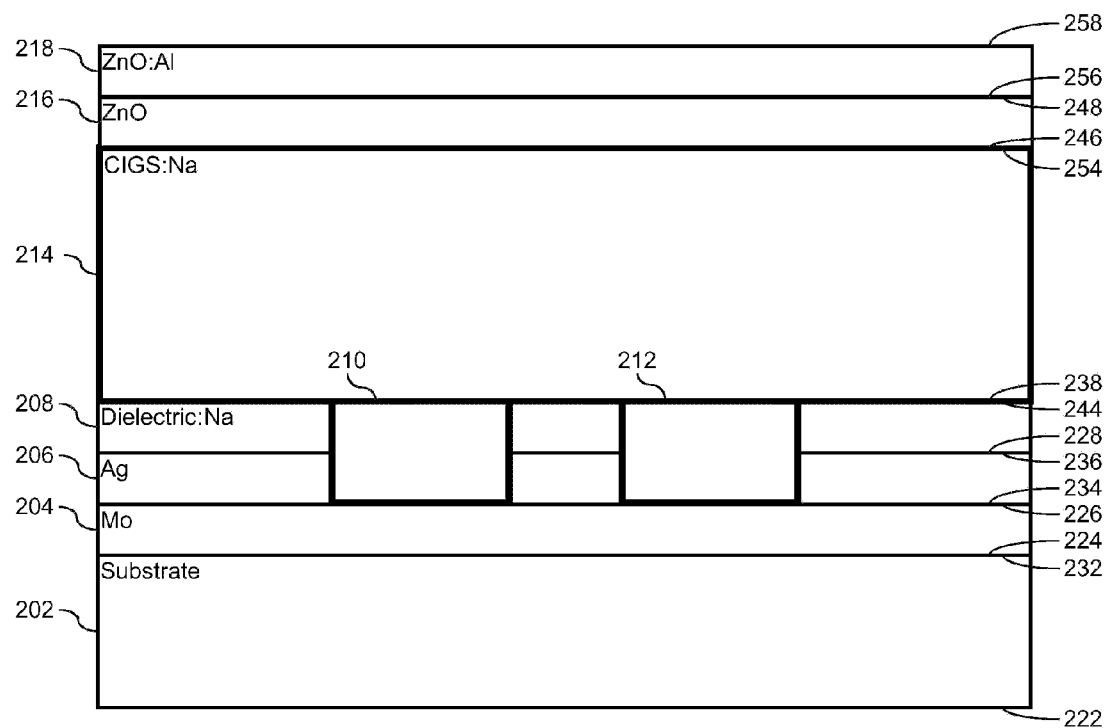
FIG. 2 is a block diagram depicting an improved solar cell.

FIG. 2 is a block diagram illustrating a stacked-layered thin-film solar cell. The solar cell is shown with a substrate layer (202) and a layer of a conducting material (204). The substrate is shown with a first surface (222) and a second surface (232). Similarly, the layer of conducting material (204) is shown having a first surface (224) and a second surface (234), with surface (224) stacked on the substrate layer (202). In one embodiment, the substrate is constructed from soda lime glass, solar glass, aluminum foil, iron (Fe), and/or polyimide (PI). The conducting material (204) provides ohmic contact to the semiconductor absorber (214) and lowers resistance for in-plane current flow. In one embodiment, the conducting material (204) is constructed from Molybdenum (Mo). The solar cell further includes a layer having a reflecting element (206) with a first surface (226) and a second surface (236), the reflecting element (206) stacked on the conducting material (204). In one embodiment, the reflecting element (206) is silver. A dielectric layer (208) is shown in communication with the reflecting layer (206). The dielectric layer (208) has a first surface (228) and a second surface (238), the first surface (228) is stacked on the reflecting layer (206). In one embodiment, the reflecting layer (206) includes an element reflective of solar radiation to reflect contacting radiation into the absorber layer (214).

At least one aperture is etched through the dielectric layer (208) and into the reflecting layer (206). While two apertures, (210) and (212) respectively, are depicted in FIG. 2, any number of apertures can be etched through the dielectric layer (208) and into the reflecting layer (206). In one embodiment, the thickness of the aperture(s) ranges from 0.1 to 0.15 micrometers. A layer of a semiconducting material (214), having a first surface (244) and a second surface (254), is stacked on the dielectric layer (208). In one embodiment, the semiconducting material is CIGS. The semiconducting layer (208) provides for electrical characteristics at the surface (244) of the semiconducting layer (214) in contact with the dielectric layer (208).

The semiconducting layer (214) fills the aperture(s), (210) and (212) respectively, formed within the dielectric layer (208) and reflecting layer (206). A first transparent layer (216) is provided as a layer within the solar cell and in communication with the semiconducting layer (214). In one embodiment, the first transparent layer (216) is comprised of Zinc Oxide (ZnO). The first transparent layer (216) has two oppositely disposed surfaces (246) and (256). In one embodiment, the semiconducting layer (214) has a base thickness between 0.5 and 5 micrometers. The base thickness is considered to be the shortest distance between the surface of the dielectric (238) in contact with the surface (244) of the semiconducting layer (214) to the surface (254) of the semiconducting layer (214) in contact with the surface (246) of the first transparent layer (216). The base thickness of the semiconducting layer therefore discounts the semiconducting material filling the aperture(s) in the dielectric and reflecting layers, (208) and (206), respectively.

A conducting second transparent layer (218) is provided. In one embodiment, the conducting second transparent layer is comprised of Zinc Oxide doped with Aluminum (ZnO: Al). This layer (218) has two oppositely disposed surfaces (248) and (258) having a first surface (248) and a second surface (258) stacked on the first transparent layer (216). The conducting second transparent layer (218) collects current from absorbed radiation. In one embodiment, the solar cell is placed in communication with a contact grid to collect electrical current. Accordingly, a stack-layered solar cell is provided.

Figure 3A:
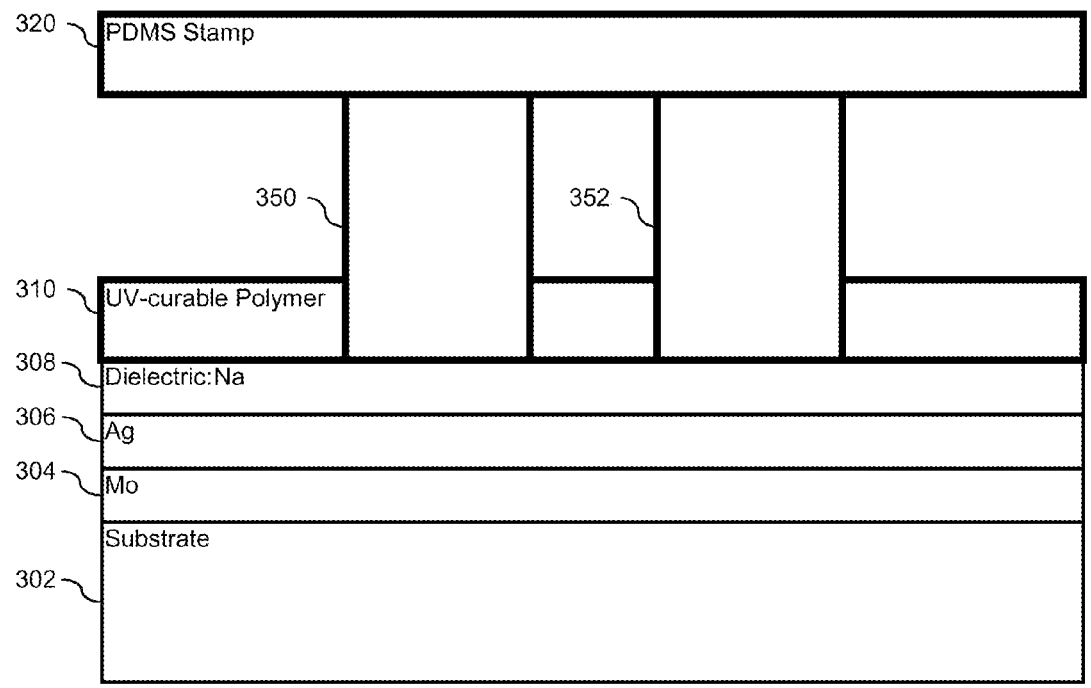
FIGS. 3A and 3B are illustrative drawings depicting soft stamping and etching a solar cell.

FIG. 3A is a block diagram (300) illustrating one embodiment for a soft stamp to etch the dielectric and silver layers of the stack-layered solar cell of FIG. 2. A substrate layer (302) is provided with a conducting layer (304) stacked on the substrate layer (302). A layer comprising a reflecting element (306) is further provided stacked on the conducting layer (304), and a dielectric layer (308) is provided stacked on the reflecting layer (306). A polymer layer (310) coats the dielectric layer (308). A soft stamp (320) is shown in communication with the solar cell layers to provide an etch mask. In one embodiment, the stamp (320) is a Polydimethylsilxane (PDMS) stamp. Similarly, in one embodiment, the polymer is removed from the protruded areas of the stamp, (350) and (352) respectively, and the remaining polymer is exposed. In one embodiment the ultraviolet radiation may be employed to cure the remaining polymer. In another embodiment, the protruded areas (350) and (352), respectively, of the soft stamp (320) are separated by a distance commensurate with an optimized electrical performance of the cell. Accordingly, the soft stamp structures the polymer to provide an etch mask subsequent to etching.

Figure 3B:
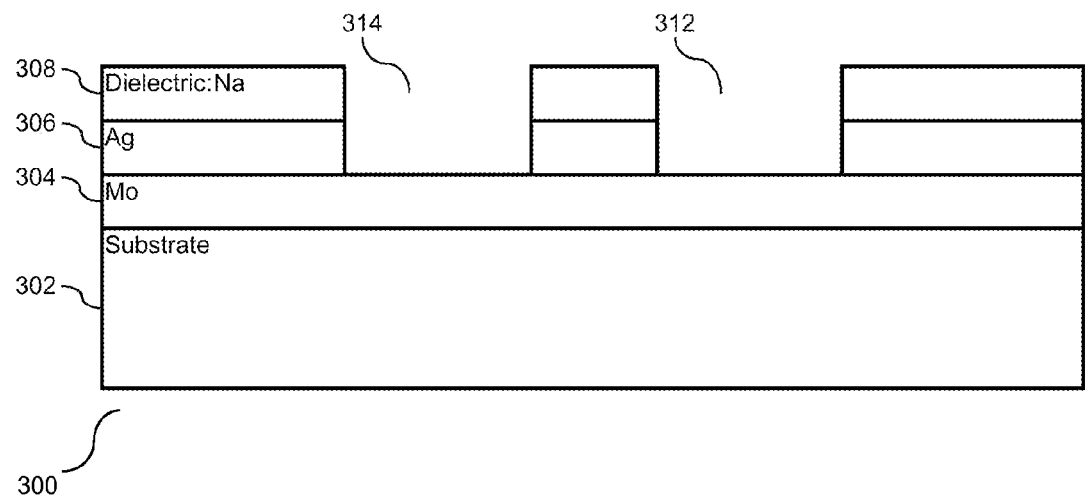

FIG. 3B depicts a block diagram illustrating the substrate layer (302), the conducting layer (304), the reflecting layer (306) and the dielectric layer (308), subsequent to etching. Two etched apertures, (312) and (314) formed by the stamp are depicted. In one embodiment, the dielectric and the reflecting elements are etched through such that at least one aperture is formed. At least one aperture is etched through the entire dielectric layer and stops within the reflecting layer (310). Similarly, in one embodiment, at least one aperture (312) is etched completely through the dielectric (308) and the reflecting element (306). Accordingly, aperture (s) (312) and (314) are formed by etching through the dielectric and reflective layers.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present embodiments has been presented for purposes of illustration and description, but is not intended to be exhaustive or limited to the form disclosed.

Many modifications and variations will be apparent to those of ordinary skill in the art without departing from the scope and spirit of the embodiments. The embodiment was chosen and described in order to best explain the principles and the practical application, and to enable others of ordinary skill in the art to understand the various embodiments with various modifications as are suited to the particular use contemplated.

It will be appreciated that, although specific embodiments have been described herein for purposes of illustration, various modifications may be made without departing from the spirit and scope. Accordingly, the scope of protection is limited only by the following claims and their equivalents.

We claim:

1. A solar cell, prepared by a process comprising the steps of:
   etching a first aperture through a reflective layer and a second aperture through a dielectric layer, the first and second apertures to form a third aperture, wherein a first side of the reflective layer is in contact with a second side of a conducting layer, a first side of the dielectric layer is in contact with a second side of the reflective layer, a first side of the conducting layer is in contact with a first side of a substrate;
   filling the third aperture with a layer of Copper Indium Gallium Selenide (CIGS) having a first side and a second side, the first side of the layer of CIGS is in direct physical contact with the second side of the conducting layer, the second side of the conducting layer continuously extends across the filled third aperture and covering a second side of the dielectric layer and the second side of the CIGS in contact with a first side of a first transparent layer; and
   depositing a second transparent layer, including a first side of second transparent layer in contact with a second side of the first transparent layer, wherein the second transparent layer comprises a conductive material.

2. The solar cell of claim 1, further comprising coating the second side of the dielectric layer with a UV-curable polymer prior to soft stamping and etching the first and second aperture, and removing the UV-curable polymer subsequent to the soft stamping and etching.

3. The solar cell of claim 2, further comprising curing the UV-curable polymer by exposing the UV-curable polymer to ultraviolet light.

4. The solar cell of claim 1, wherein the conducting layer is prepared by sputtering.

5. The solar cell of claim 1, wherein the reflective layer is prepared by sputtering.

6. The solar cell of claim 5, further comprising separating and interconnecting areas of the solar cell into sub cells by a method selected from the group consisting of mechanical scribing and laser-scribing.

7. The solar cell of claim 1, further comprising encapsulating the solar cell to form a module.

8. The solar cell of claim 1, wherein the conducting layer comprises Molybdenum.

9. A solar cell, prepared by a process comprising the steps of:
   depositing a conducting layer on a substrate layer, wherein a first surface of the substrate layer is in communication with a first surface of the conducting layer;
   depositing a reflective layer on the conducting layer, wherein a second surface of the conducting layer is in communication with a first surface of the reflective layer;
   depositing a dielectric layer on the reflective layer, wherein a second surface of the reflective layer is in communication with a first surface of the dielectric layer;
   etching one or more apertures, wherein the one or more apertures extend through the dielectric layer and the reflective layer;
   depositing a semiconductor layer, including:
      filling the one or more apertures with Copper Indium Gallium Selenide (CIGS), wherein a first portion of a first surface of the semiconductor layer is in direct physical communication with the second surface of the conducting layer and the second surface of the conducting layer continuously extends across the filled one or more apertures;
      covering a second surface of the dielectric layer with the CIGS, wherein a second portion of the first surface of the semiconductor layer is in communication with the second surface of the dielectric layer;
   depositing a first transparent layer on the semiconductor layer, wherein a first surface of the first transparent layer is in communication with a second surface of the semiconductor layer; and
   depositing a second transparent layer on the first transparent layer, wherein a first surface of second transparent layer in communication with a second surface of the first transparent layer, the second transparent layer comprises a conductive material.

10. The solar cell of claim 9, further comprising coating the second surface of the dielectric layer with a UV-curable polymer prior to a soft stamping and etching the one or more apertures, and removing the UV-curable polymer subsequent to the soft stamping and etching.

11. The solar cell of claim 10, further comprising curing the UV-curable polymer by exposing the UV-curable polymer to ultraviolet light.

12. The solar cell of claim 9, wherein the depositing the conducting layer includes sputtering.

13. The solar cell of claim 9, wherein depositing the reflective layer includes sputtering.

14. The solar cell of claim 13, further comprising separating areas of the solar cell into sub cells by a method selected from the group consisting of mechanical scribing and laser-scribing.

15. The solar cell of claim 14, further comprising interconnecting the sub cells of the solar cell.

16. The solar cell of claim 9, further comprising encapsulating the solar cell to form a module, wherein the encapsulating prevents mechanical and environmental degradation.

17. The solar cell of claim 9, wherein the conducting layer comprises Molybdenum.

18. A solar cell, prepared by a process comprising the steps of:
   depositing a conducting layer on a substrate layer, wherein a first surface of the substrate layer is in communication with a first surface of the conducting layer;
   depositing a reflective layer on the conducting layer, wherein a second surface of the conducting layer is in communication with a first surface of the reflective layer, wherein a first aperture is formed in the reflective layer;
   depositing a dielectric layer on the reflective layer, wherein a second surface of the reflective layer is in communication with a first surface of the dielectric layer, wherein a second aperture is created in the dielectric layer, wherein the first and second apertures are created in alignment forming a third aperture;
   depositing a semiconductor layer, including:
      filling the third aperture with Copper Indium Gallium Selenide (CIGS), wherein a first portion of a first surface of the semiconductor layer is in direct physical communication with the second surface of the conducting layer;
      covering a second surface of the dielectric layer with the CIGS, wherein a second portion of the first surface of the semiconductor layer is in communication with the second surface of the dielectric layer;
   depositing a first transparent layer on the semiconductor layer, wherein a first surface of the first transparent layer is in communication with a second surface of the semiconductor layer; and
   depositing a second transparent layer on the first transparent layer, wherein a first surface of second transparent layer in communication with a second surface of the first transparent layer, the second transparent layer comprises a conductive material.

* * * * *